United States Patent
Miller et al.

(10) Patent No.: US 9,520,181 B1
(45) Date of Patent: Dec. 13, 2016

(54) SUPERCONDUCTING PHASE-CONTROLLED HYSTERETIC MAGNETIC JOSEPHSON JUNCTION JMRAM MEMORY CELL

(71) Applicants: Donald L. Miller, Export, PA (US); Andrew Hostetler Miklich, Columbia, MD (US); Anna Y. Herr, Ellicott City, MD (US); Quentin P. Herr, Ellicott City, MD (US); William Robert Reohr, Severna Park, MD (US)

(72) Inventors: Donald L. Miller, Export, PA (US); Andrew Hostetler Miklich, Columbia, MD (US); Anna Y. Herr, Ellicott City, MD (US); Quentin P. Herr, Ellicott City, MD (US); William Robert Reohr, Severna Park, MD (US)

(73) Assignee: Northrop Grumman Systems Corporation, Falls Church, VA (US)

( * ) Notice: Subject to any disclaimer, the term of this patent is extended or adjusted under 35 U.S.C. 154(b) by 0 days.

(21) Appl. No.: 14/854,994

(22) Filed: Sep. 15, 2015

(51) Int. Cl.
*G11C 11/44* (2006.01)
*G11C 11/16* (2006.01)

(52) U.S. Cl.
CPC .......... *G11C 11/44* (2013.01); *G11C 11/1673* (2013.01); *G11C 11/1675* (2013.01)

(58) Field of Classification Search
CPC ... G11C 11/44; G11C 11/1673; G11C 11/1675
USPC .................. 365/162, 160, 171, 173
See application file for complete search history.

(56) References Cited

U.S. PATENT DOCUMENTS

| 6,078,517 | A | * | 6/2000 | Herr | G11C 11/44 365/160 |
| 8,270,209 | B2 | * | 9/2012 | Herr | G11C 11/44 365/158 |
| 9,013,916 | B2 | * | 4/2015 | Naaman | G11C 11/44 365/162 |
| 2011/0267878 | A1 | * | 11/2011 | Herr | G11C 11/44 365/171 |

* cited by examiner

*Primary Examiner* — Tan T. Nguyen
(74) *Attorney, Agent, or Firm* — Tarolli, Sundheim, Covell & Tummino LLP

(57) ABSTRACT

One embodiment describes a JMRAM memory cell system. The system includes a phase hysteretic magnetic Josephson junction (PHMJJ) that stores one of a first binary state and a second binary state in response to a write current provided during a data write operation and to provide a superconducting phase based on the stored digital state. The system also includes a directional write element configured to provide a directional bias current during the data write operation to provide the superconducting phase of the PHMJJ in a predetermined direction corresponding to the first binary state. The system further includes at least one Josephson junction having a critical current that is based on the superconducting phase of the PHMJJ and being configured to provide an output corresponding to the stored digital state in response to a read current that is provided during a read operation.

20 Claims, 6 Drawing Sheets

SUPERCONDUCTING PHASE-CONTROLLED HYSTERETIC MAGNETIC JOSEPHSON JUNCTION JMRAM MEMORY CELL

TECHNICAL FIELD

The present invention relates generally to quantum and classical digital superconducting circuits, and specifically to a superconducting phase-controlled hysteretic magnetic Josephson junction JMRAM memory cell.

BACKGROUND

Superconducting digital technology has provided computing and/or communications resources that benefit from unprecedented high speed, low power dissipation, and low operating temperature. For decades, superconducting digital technology has lacked random-access memory (RAM) with adequate capacity and speed relative to logic circuits. This has been a major obstacle to industrialization for current applications of superconducting technology in telecommunications and signal intelligence, and can be especially forbidding for high-end and quantum computing. All concepts currently considered for superconducting memory have been based on quantization of magnetic flux quanta in a superconducting inductive loop. Such memories can be readily adapted to high speed register files given a foundry process with adequate yield, but can never achieve the integration density of complementary metal-oxide semiconductor (CMOS), as they are fundamentally limited by the size of the inductive loop. One hybrid memory solution has been proposed where the memory core implements CMOS technology and the bit-line detection is done with Josephson devices. However, such a configuration yields only nominally higher performance than standard CMOS and suffers from relatively high power dissipation for a cryogenic environment.

SUMMARY

One embodiment describes a JMRAM memory cell system. The system includes a phase hysteretic magnetic Josephson junction (PHMJJ) that stores one of a first binary state and a second binary state in response to a write current provided during a data write operation and to provide a superconducting phase based on the stored digital state. The system also includes a directional write element configured to provide a directional bias current during the data write operation to provide the superconducting phase of the PHMJJ in a predetermined direction corresponding to the first binary state. The system further includes at least one Josephson junction having a critical current that is based on the superconducting phase of the PHMJJ and being configured to provide an output corresponding to the stored digital state in response to a read current that is provided during a read operation.

Another aspect of the present invention includes a method for writing a digital state to a JMRAM memory cell in a JMRAM system during a data write operation. The method includes generating a word-write current on a word-write line to select a respective one of a plurality of rows of an array of JMRAM memory cells. Each of the JMRAM memory cells comprises a PHMJJ that is magnetically coupled to the word-write line and to a bit-write line and that is configured to store the digital state corresponding to one of a first binary state and a second binary state. The method also includes generating a bit-write current on the bit-write line associated with each of a plurality of columns of the array of JMRAM memory cells, the digital state of the PHMJJ being set in response to the word-write current and the bit-write current. The method further includes generating a directional bias current through the PHMJJ in a predetermined direction, the directional bias current providing a superconducting phase of the PHMJJ in the predetermined direction corresponding to the first binary state.

Another aspect of the present invention includes a JMRAM memory array. The memory array includes a plurality of JMRAM memory cells. Each of the plurality of JMRAM memory cells includes a PHMJJ, a directional write element configured to provide a directional bias current during a data write operation to set the PHMJJ in a positive $\pi$-state corresponding to a first binary state, and at least one Josephson junction. The memory array also includes a plurality of word-write lines each configured to conduct a respective word-write current that selects a given row of the plurality of JMRAM memory cells during the data write operation. The memory array also includes a plurality of bit-write lines each configured to conduct a respective bit-write current to write a digital state corresponding to one of a first binary state and a second binary state into the PHMJJ associated with each JMRAM memory cell of the given row of plurality of JMRAM memory cells, the PHMJJ being magnetically coupled to a respective one of the plurality of word-write lines and a respective one of the plurality of bit-write lines. The memory array also includes a plurality of word-read lines each configured to conduct a respective word-read current that selects a given row of plurality of JMRAM memory cells during a data read operation. The memory array further includes a plurality of bit-read lines each configured to conduct a respective bit-read current through each of the plurality of JMRAM memory cells in a given column. The at least one Josephson junction can provide an indication of the stored digital state during the data read operation in response to the word-read current, the bit-read current, and a superconducting phase provided by the PHMJJ.

DETAILED DESCRIPTION

The present invention relates generally to quantum and classical digital superconducting circuits, and specifically to a superconducting phase-controlled hysteretic magnetic Josephson junction JMRAM memory cell. The JMRAM system can implement an array of JMRAM memory cells that each includes a phase hysteretic magnetic Josephson junction (PHMJJ) that can be configured as including ferromagnetic materials in an associated barrier. As an example, the PHMJJ can be configured as a junction switchable between a zero state and a π-state that is configured to generate a superconducting phase based on the digital state stored therein. The JMRAM memory cells can also each include at least one Josephson junction (e.g., a pair of Josephson junctions in parallel with the PHMJJ). The PHMJJ can be configured to store a digital state corresponding to one of a first binary state (e.g., logic-1) or a second binary state (e.g., logic-0) in response to a word-write current and a bit-write current associated with the PHMJJ. For example, the first binary state can correspond to a positive π-state, in which a superconducting phase is provided. As an example, the word-write and bit-write currents can each be provided on dedicated word-write and bit-write lines, and can set the logic state of the PHMJJ based on respective current flow directions relative to each other. Moreover, to prevent the PHMJJ to be set to an undesired negative π-state, the PHMJJ can include a directional write element that is configured to generate a directional bias current through the PHMJJ during a data write operation. Thus, the PHMJJ can be forced into the positive π-state to provide the superconducting phase in a predetermined direction.

In addition, the PHMJJ of each of the JMRAM memory cells of the array can provide an indication of the stored digital state in response to a word-read current and a bit-read current. The superconducting phase can thus lower a critical current associated with the at least one Josephson junction of each of the JMRAM memory cells of a row of the array. Therefore, the word-read current and the bit-read current can be provided to trigger the Josephson junction(s) to change a voltage on the associated bit-read line based on the PHMJJ storing the first binary state, and to not trigger based on the PHMJJ storing a digital state corresponding to the second binary state. Thus, the bit-read line can have a voltage having a magnitude that varies based on whether the digital state of the PHMJJ corresponds to the binary logic-1 state or the binary logic-0 state (e.g., between a non-zero and a zero amplitude). As described herein, the term "trigger" with respect to Josephson junctions describes the phenomenon of the Josephson junction generating a discrete voltage pulse in response to a current flow through the Josephson junction exceeding a critical current.

Figure 1:
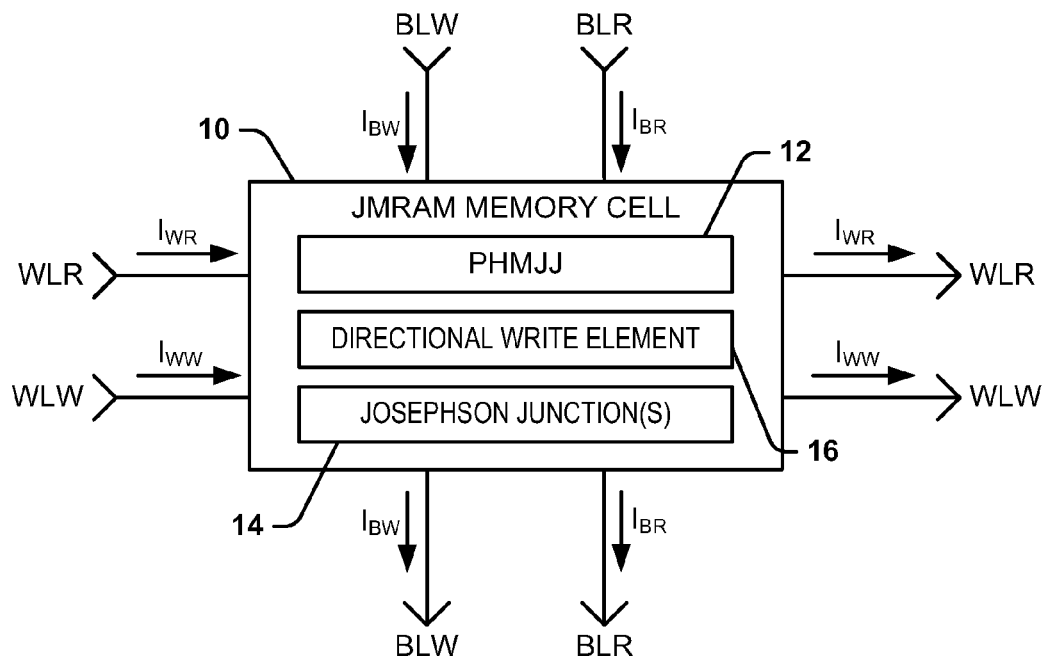
FIG. 1 illustrates an example of a JMRAM memory cell.

FIG. 1 illustrates an example of a JMRAM memory cell 10. As an example, the JMRAM memory cell 10 can correspond to one of a plurality of JMRAM memory cells that are arranged in an array as rows and columns, as described in greater detail herein. The JMRAM memory cell 10 includes a word-write line WLW and a word-read line WLR that each pass through the JMRAM memory cell 10. The word-write line WLW conducts a word-write current $I_{WW}$ during a data write operation and the word-read line WLR conducts a word-read current $I_{WR}$ during a data read operation. As an example, the word-write current $I_{WW}$ can correspond to a word-write current associated with a row of JMRAM memory cells in an array, and the word-read current $I_{WR}$ can correspond to a word-read current associated with the row of JMRAM memory cells in the array. For example, the word-write and word-read lines WLW and WLR can likewise be coupled to adjacent JMRAM memory cells in a given row on either side of the JMRAM memory cell 10. Thus, the word-read and word-write currents $I_{WW}$ and $I_{WR}$ flow through all of the JMRAM memory cell systems in the row, including the JMRAM memory cell 10, during the respective data write and data read operations.

Similarly, the JMRAM memory cell 10 includes a bit-write line BLW and a bit-read line BLR that each pass through the JMRAM memory cell 10. The bit-write line BLW conducts a bit-write current $I_{BW}$ during the data write operation and the bit-read line BLR conducts a bit-read current $I_{BR}$. As an example, the bit-read current $I_{BR}$ can be provided on the bit-read line BLR substantially constantly, and not just during data read operations. For example, the bit-write current $I_{BW}$ can correspond to a bit-write current associated with a column of JMRAM memory cells in the array, and the bit-read current $I_{BR}$ can correspond to a bit-read current associated with the column of JMRAM memory cells in the array. In a similar manner, the bit-write and bit-read lines BLW and BLR can likewise be coupled to adjacent JMRAM memory cells in a given column above and below the JMRAM memory cell 10. Thus, the bit-write and bit-read currents $I_{BW}$ and $I_{BR}$ flow through all of the JMRAM memory cell systems in the column, including the JMRAM memory cell 10, during the respective data write and data read operations.

The JMRAM memory cell 10 also includes a phase hysteretic magnetic Josephson junction (PHMJJ) 12 that is configured to store a digital state corresponding to one of a first binary state (e.g., logic-1) or a second binary state (e.g., logic-0). As an example, the PHMJJ 12 can include ferromagnetic materials in associated barriers to be configured as a switchable π-junction. The PHMJJ 12 can include outer layers of superconducting material, such as Niobium (Nb), and one or more internal thin film layers of ferromagnetic materials. As an example, the thin film layers of ferromagnetic materials can include one or more "hard" ferromagnetic layers having a substantially fixed magnetic field and one or more "soft" ferromagnetic layers that can be changed as a result of magnetic fields generated locally by orthogonal electrical currents. Additionally, the PHMJJ 12 can include one or more additional layers, such as oxide layers, that are interleaved with the superconducting and/or ferromagnetic layers. Furthermore, the JMRAM memory cell 10 can include at least one Josephson junction 14 that can be triggered during the data read operation in response to the respective word-read and bit-read currents $I_{WR}$ and $I_{BR}$ to indicate that the PHMJJ 12 is in the first binary state, or not triggered to indicate that the PHMJJ 12 is in the second binary state, as described in greater detail herein.

In response to the magnetic fields generated locally by orthogonal electrical currents, the PHMJJ 12 can be set to a π-state in which the PHMJJ 12 generates a superconducting phase. As described herein, the "superconducting phase" generates a spontaneous supercurrent in any superconducting loop through the PHMJJ 12, with the supercurrent having a magnitude that is approximately equal to one-half a superconductor flux quantum divided by an inductance term. As described in greater detail herein, the supercurrent can combine with the respective word-read and bit-read currents $I_{WR}$ and $I_{BR}$ to indicate the digital state of the PHMJJ 12.

In memory cells that implement a PHMJJ, when the state of the PHMJJ is set to a predetermined logic state (e.g., a logic-1 state), the direction of the superconducting phase, and thus whether the PHMJJ is in a positive π-state or a negative π-state can be unpredictable (e.g., based on a substantially constant application of a respective bit-read current as a bias current). Additionally, in the positive π-state, relatively greater margins can be achieved with respect to the amplitude of the respective word-read and bit-read currents during the data read operation relative to the threshold currents of associated Josephson junction(s).

However, in the negative π-state, the associated PHMJJ can exhibit relatively smaller margins with respect to the amplitude of the respective word-read and bit-read currents during the data read operation relative to the threshold currents of the associated Josephson junction(s). Thus, in the negative π-state, the smaller margins can provide unreliability of a given memory cell that implements a PHMJJ during a data read operation, and can thus result in unpredictability in reading the digital state.

To provide predictable setting of the PHMJJ 12 in the positive π-state during a data write operation in which the PHMJJ 12 stores the first binary state, the JMRAM memory cell 10 includes a directional write element 16. The directional write element 16 is configured to generate a directional bias current through the PHMJJ 12 during the data write operation to set the PHMJJ 12 to the positive π-state corresponding to the first binary state. For example, the directional write element 16 can be configured as a transformer that is configured to generate the directional bias current through the PHMJJ 12 based on one of the word-read current $I_{WR}$ and the word-write current $I_{WW}$ during the data write operation. Accordingly, when the PHMJJ 12 is to store the first binary state during a data write operation, the PHMJJ 12 can be consistently set to the positive π-state, such that relatively greater margins can be achieved with respect to the amplitude of the respective word-read and bit-read currents $I_{WR}$ and $I_{BR}$ during the data read operation relative to the threshold currents of the Josephson junction (s) 14 to read the digital state from the JMRAM memory cell 10.

Figure 2:
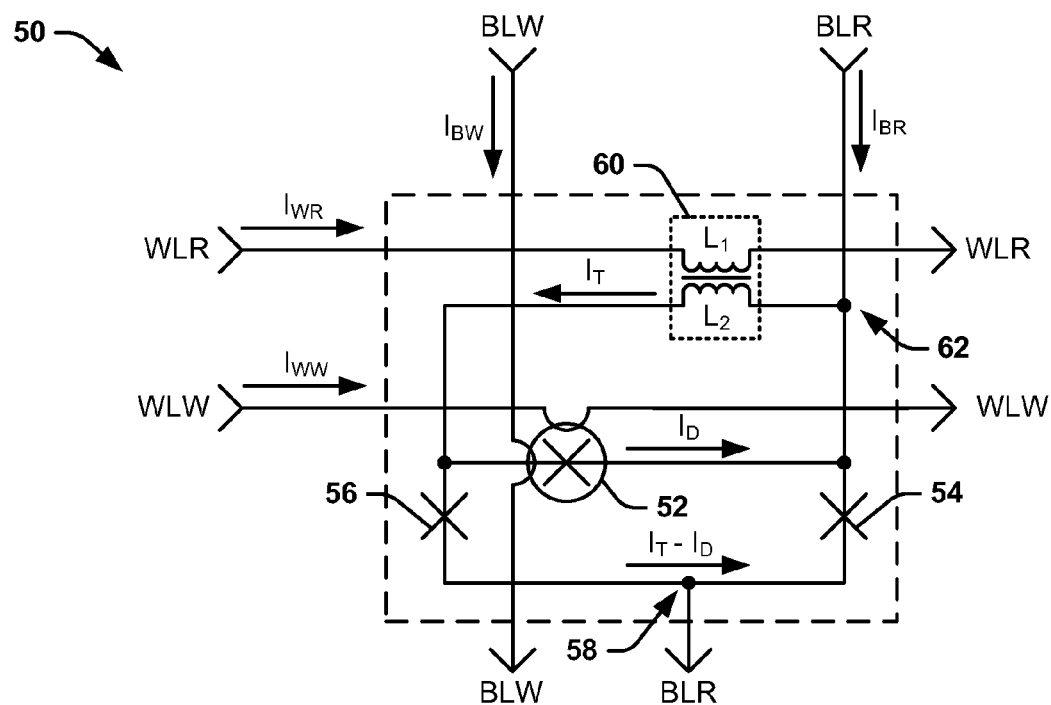
FIG. 2 illustrates an example of a JMRAM memory cell circuit.

FIG. 2 illustrates an example of a JMRAM memory cell circuit 50. As an example, the JMRAM memory cell circuit 50 can correspond to one of a plurality of JMRAM memory cells that are arranged in an array as rows and columns, as described in greater detail herein. The JMRAM memory cell circuit 50 can correspond to the JMRAM memory cell 10 in the example of FIG. 1.

The JMRAM memory cell circuit 50 includes a word-write line WLW and a word-read line WLR that each pass through the JMRAM memory cell circuit 50. The word-write line WLW conducts a word-write current $I_{WW}$ during a data write operation and the word-read line WLR conducts a word-read current $I_{WR}$ during a data read operation. As an example, the word-write current $I_{WW}$ can correspond to a word-write current associated with a row of JMRAM memory cells in an array, and the word-read current $I_{WR}$ can correspond to a word-read current associated with the row of JMRAM memory cells in the array. For example, the word-write and word-read lines WLW and WLR can likewise be coupled to adjacent JMRAM memory cells in a given row on either side of the JMRAM memory cell circuit 50. Thus, the word-read and word-write currents $I_{WW}$ and $I_{WR}$ flow through all of the JMRAM memory cell systems in the row, including the JMRAM memory cell circuit 50, during the respective data write and data read operations.

Similarly, the JMRAM memory cell circuit 50 includes a bit-write line BLW and a bit-read line BLR that each pass through the JMRAM memory cell circuit 50. The bit-write line BLW conducts a bit-write current $I_{BW}$ during the data write operation and the bit-read line BLR conducts a bit-read current $I_{BR}$ during the data read operation. As an example, the bit-write current $I_{BW}$ can correspond to a bit-write current associated with a column of JMRAM memory cells in the array, and the bit-read current $I_{BR}$ can correspond to a bit-read current associated with the column of JMRAM memory cells in the array. In a similar manner, the bit-write and bit-read lines BLW and BLR can likewise be coupled to adjacent JMRAM memory cells in a given column above and below the JMRAM memory cell circuit 50. Thus, the bit-read and bit-write currents $I_{BW}$ and $I_{BR}$ flow through all of the JMRAM memory cell systems in the column, including the JMRAM memory cell circuit 50, during the respective data write and data read operations.

The JMRAM memory cell circuit 50 also includes a PHMJJ 52 that is configured to store a digital state corresponding to one of the first binary state (e.g., logic-1) or the second binary state (e.g., logic-0), and can be arranged substantially similar to the PHMJJ 12 described previously in the example of FIG. 1. In the example of FIG. 2, the word-write line WLW and the bit-write line BLW are demonstrated as magnetically coupled to the PHMJJ 52, such that the magnetic field orientation of the one or more ferromagnetic layers of the PHMJJ 52 can be changed as a result of magnetic fields that are generated locally by the word-write current $I_{WW}$ and the bit-write current $I_{BW}$. Therefore, based on the configuration of the PHMJJ 52, the word-write current $I_{WW}$ and the bit-write current $I_{BW}$ can generate the magnetic field to set the digital state of the PHMJJ 52 to the first binary state or the second binary state using magneto-current states of the PHMJJ 52, such as based on the respective directions of current flow during a data write operation. A variety of ways of writing the digital state of the PHMJJ 52 can be implemented based on the current directions, durations, and/or amplitudes of the word-write current $I_{WW}$ and the bit-write current $I_{BW}$. As described in greater detail herein, in response to the data write operation, the PHMJJ 52 can have a superconducting phase that can be associated with a stable π-state (e.g., a positive π-state resulting in a positive superconducting phase) corresponding to the first binary state, or can be associated with a stable zero state (e.g., zero superconducting phase) corresponding to the second binary state.

In addition, the JMRAM memory cell circuit 50 includes a first Josephson junction 54 and a second Josephson junction 56. The Josephson junctions 54 and 56 are arranged in a loop with respect to the PHMJJ 52, and are coupled to the bit-read line BLR at a node 58. As described in greater detail herein, the Josephson junctions 54 and 56 can be implemented in a data read operation to indicate the stored digital state of the PHMJJ 52. For example, the Josephson junctions 54 and 56 can be triggered during the data read operation in response to the respective word-read and bit-read currents $I_{WR}$ and $I_{BR}$, as well as a predetermined direction of the superconducting phase associated with the PHMJJ 52, to indicate that the PHMJJ 52 is in the first binary state, or not triggered to indicate that the PHMJJ 52 is in the second binary state, as described in greater detail herein.

In the example of FIG. 2, the JMRAM memory cell circuit 50 includes a transformer 60 that includes a primary winding $L_1$ on the word-read line WLR through which the word-read current $I_{WR}$ flows. The transformer 60 also includes a secondary winding $L_2$ that is inductively coupled to the primary winding $L_1$ and is arranged in parallel with the PHMJJ 52. As one example, the transformer 60 can correspond to the directional write element 16 in the example of FIG. 1. For example, during a data write operation in which the first logic state (e.g., a logic-1) is to be written to the PHMJJ 52, the word-read current $I_{WR}$ can be provided on the word-read line WLR, and thus through the primary winding $L_1$, to induce a current $I_T$ that is provided via the secondary winding $L_2$. The current $I_T$ can be divided, such that a first portion of the current $I_T$ can flow through the PHMJJ 52 as a directional bias current $I_D$ and a second portion can flow through the Josephson junctions 54 and 56 as a current $I_T$-$I_D$.

The current $I_T$ can have a predetermined amplitude that is set to avoid triggering the Josephson junctions 54 and 56 via the current $I_T$-$I_D$ during the data write operation described herein. The directional bias current $I_D$ can thus flow a predetermined direction through the PHMJJ 52. Therefore, the magnetic coupling of the word-write current $I_{WW}$ and the bit-write current $I_{BW}$ can set the magnetic state of the PHMJJ 52, while the directional bias current $I_D$ concurrently biases the PHMJJ 52 to force the directionality of the phase of the PHMJJ 52 in a predetermined direction. As a result, the PHMJJ 52 can be forced into being set in the positive π-state in response to the directional bias current $I_D$.

In addition to the word-read current $I_{WR}$ being provided in the data write operation to generate the directional bias current $I_D$, the word-read current $I_{WR}$ can also be provided on the word-read line WLR during the data read operation to bias the Josephson junctions 54 and 56 to read the digital state of the PHMJJ 52. As described herein, the word-read current $I_{WR}$ being provided to the Josephson junctions 54 and 56 can refer to the word-read current $I_{WR}$ being provided to the Josephson junctions 54 and 56 directly or inductively, as described in the example of FIG. 2. In the example of FIG. 2, the bit-read line BLR is coupled to a node 62 between the secondary winding $L_2$ and the Josephson junction 54, such that the bit-read current $I_{BR}$ enters the JMRAM memory cell circuit 50 at the node 5. The bit-read line BLR is also coupled to the node 58 corresponding to an output of the JMRAM memory cell circuit 50 between the Josephson junctions 54 and 56, such that the bit-read current $I_{BR}$ exits the JMRAM memory cell circuit 50 from the node 58.

The digital state of the PHMJJ 52 can be read from the JMRAM memory cell circuit 50 in response to the word-read current $I_{WR}$ and the bit-read current $I_{BR}$. Specifically, the word-read current $I_{WR}$ can be provided on the word-read line WLR to select the row of JMRAM memory cells in the associated memory array. As an example, the word-read current $I_{WR}$ flows through the primary winding $L_1$ of the transformer 60 as a current pulse. The current pulse of the word-read current $I_{WR}$ is thus inductively provided to the PHMJJ 52 and the Josephson junctions 54 and 56, and the bit-read current $I_{BR}$ is provided at the node 62. Therefore, the current induced by the word-read current $I_{WR}$ via the secondary winding $L_2$ is added to the bit-read current $I_{BR}$ based on the direction of current flow of the word-read current $I_{WR}$. The stored binary digital state of the PHMJJ 52 can be determinative of the critical current necessary to trigger the Josephson junctions 54 and 56 based on the superconducting phase that can be provided by the PHMJJ 52.

For example, if the PHMJJ 52 is in the zero state, and thus stores the second binary state (e.g., logic-0), the PHMJJ 52 is in a substantially minimum Josephson energy ground state that does not provide superconducting phase. Therefore, the added magnitude of the bit-read current $I_{BR}$ and the word-read current $I_{WR}$, as provided to the Josephson junctions 54 and 56, is not sufficient to trigger the Josephson junctions 54 and 56. Accordingly, a voltage on the bit-read line BLR can remain at a substantially decreased magnitude (e.g., zero volts) to indicate the second binary state. However, as another example, if the PHMJJ 52 is in the positive π-state, and thus stores the first binary state (e.g., logic-1), the PHMJJ 52, having relaxed to a substantially minimum Josephson energy from its zero-phase substantially maximal Josephson energy, provides a superconducting phase in the predetermined direction dictated by the positive π-state that adds supercurrent (demonstrated herein as a current $I_\pi$) to the magnitude of the bit-read current $I_{BR}$ and the word-read current $I_{WR}$. Therefore, the contribution of the superconducting phase, the bit-read current $I_{BR}$, and the word-read current $I_{WR}$, as provided to the Josephson junctions 54 and 56, is sufficient to trigger the Josephson junctions 54 and 56. Accordingly, the Josephson junctions 54 and 56 can trigger in an oscillatory manner to increase the voltage on the bit-read line BLR to indicate the first binary state.

Figure 3:
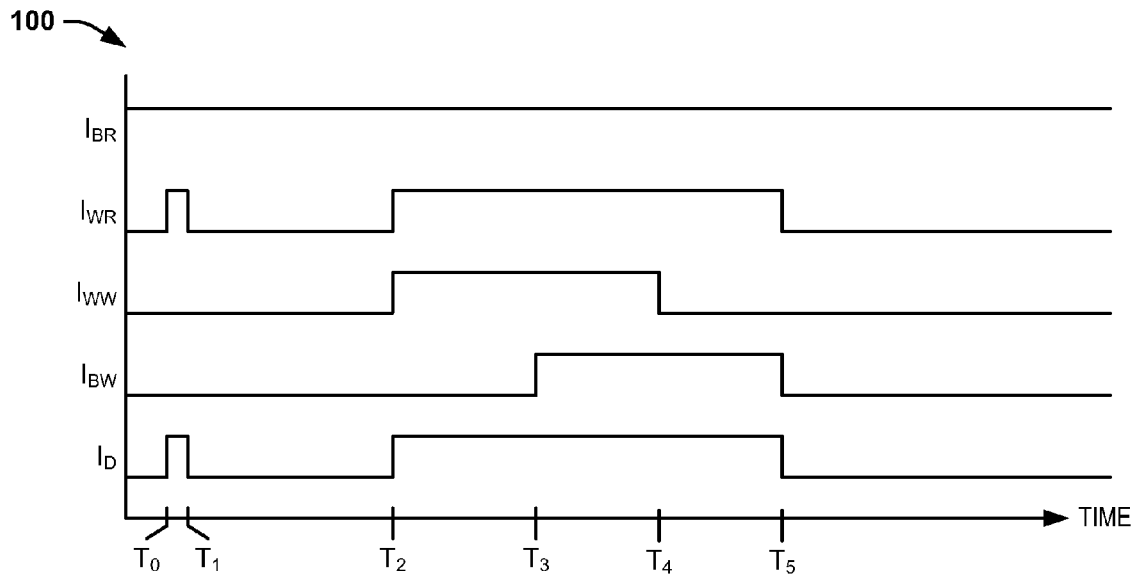
FIG. 3 illustrates an example of a timing diagram.

FIG. 3 illustrates an example of a timing diagram 100. The timing diagram 100 can correspond to a data write operation in which the first binary state (e.g., logic-1) is written to the PHMJJ 52 in the example of FIG. 2. Therefore, reference is to be made to the example of FIG. 2 in the following description of the example of FIG. 3. The data write operation described in the example of FIG. 3 is provided as a toggle write operation. However, it is to be understood that other types of write operations can be implemented in the data write operation to write the first binary state to the PHMJJ 52. In addition, the amplitudes of the signals are demonstrated at arbitrary values, and are not intended to be to scale with respect to each other, but only to provide relative values for each respective one of the signals at a given time.

Prior to a time $T_0$, the bit-read current $I_{BR}$ can be provided at a predetermined amplitude on the bit-read line BLR. As an example, the bit-read current $I_{BR}$ can be provided substantially constantly through the JMRAM memory cell circuit 50. At the time $T_0$, the word-read current $I_{WR}$ can be applied on the word-read WLR. In response, based on the inductive coupling of the transformer 60, a read bias current (e.g., the current $I_T$) is generated to flow through the secondary winding $L_2$, thus providing the directional bias current $I_D$ through the PHMJJ 52. Accordingly, the JMRAM memory cell circuit 50 can be read in a data read operation prior to the data write operation to determine the stored digital state in the PHMJJ 52 (e.g., via a sense amplifier), and thus in the JMRAM memory cell circuit 50, for the toggle data write operation. As an example, the associated sense amplifier can determine that the PHMJJ 52 stores the second binary state, and thus it is necessary to change the digital state from the second binary state to the first binary state. At a time $T_1$, the word-read current $I_{WR}$, and thus also the current $I_T$ and the resulting directional bias current $I_D$, is deactivated to cease the data read operation.

At a time $T_2$, the data write operation begins. The word-write current $I_{WW}$ is provided on the word-write line WLW to provide a half-select magnetic field with respect to the PHMJJ 52 based on the magnetic coupling of the word-write line WLW and the PHMJJ 52. As an example, the word-write current $I_{WW}$ can be provided to select an entire row of an array of JMRAM memory cells, with the JMRAM memory cell circuit 50 being one of the JMRAM memory cells in the row. In addition, the word-read current $I_{WR}$ is provided on the word-read line WLR. In response, based on the inductive coupling of the transformer 60, the directional bias current $I_D$ is likewise generated as a portion of the current $I_T$ to flow through the secondary winding $L_2$. Therefore, the directional bias current $I_D$ is provided through the PHMJJ 52 in a predetermined direction to force the PHMJJ 52 to be set in the positive π-state. As an example, the word-read current $I_{WR}$ can be provided at a predetermined amplitude, such that the amplitude of the directional bias current $I_D$ can be sufficiently small to prevent triggering of the Josephson junctions 54 and 56.

At a time $T_3$, the bit-write current $I_{BW}$ is provided on the bit-write line BLW. Therefore, the bit-write current $I_{BW}$ can provide a half-select magnetic field with respect to the PHMJJ 52 based on the magnetic coupling of the bit-write line BLW and the PHMJJ 52. As a result, beginning at the time $T_3$, the PHMJJ 52 can be provided a full-select magnetic field, such that the magnetic orientation soft ferromagnetic layers of the PHMJJ 52 can be changed as a result of the magnetic fields provided by the word-write current $I_{WW}$ and the bit-write current $I_{BW}$. Accordingly, the digital state of the PHMJJ 52 can be changed from the second binary state to the first binary state, and thus from the zero stable state (e.g., ground state) to the π-state. Additionally, because the directional bias current $I_D$ is provided through the PHMJJ 52 in the predetermined direction, the PHMJJ 52 can be switched to the positive π-state, such that the superconducting phase of the PHMJJ 52 is provided in a predetermined direction with respect to the current directions of the bit-read current $I_{BR}$ and the word-read current $I_{WR}$.

At the time T4, the word-write current $I_{WW}$ is deactivated. Therefore, the magnetic field that is provided to the PHMJJ 52 based on the magnetic coupling of the word-write line WLW to the PHMJJ 52 is deactivated. As a result, a half-select magnetic field is provided to the PHMJJ 52 via the bit-write current $I_{BW}$ based on the magnetic coupling of the bit-write line BLW and the PHMJJ 52. At a time $T_5$, the bit-write current $I_{BW}$ is deactivated, thus deactivating the magnetic field provided to the PHMJJ 52 entirely. Additionally, the word-read current $I_{WR}$ is likewise deactivated, thus also deactivating the directional bias current $I_D$ based on the inductive coupling of the word-read current $I_{WR}$ via the transformer 60. Therefore, the data write operation is concluded, at which time the PHMJJ 52 stores the first binary state based on having a positive π-state to provide the superconducting phase in a predetermined direction with respect to the current directions of the bit-read current $I_{BR}$ and the word-read current $I_{WR}$.

Figure 4:
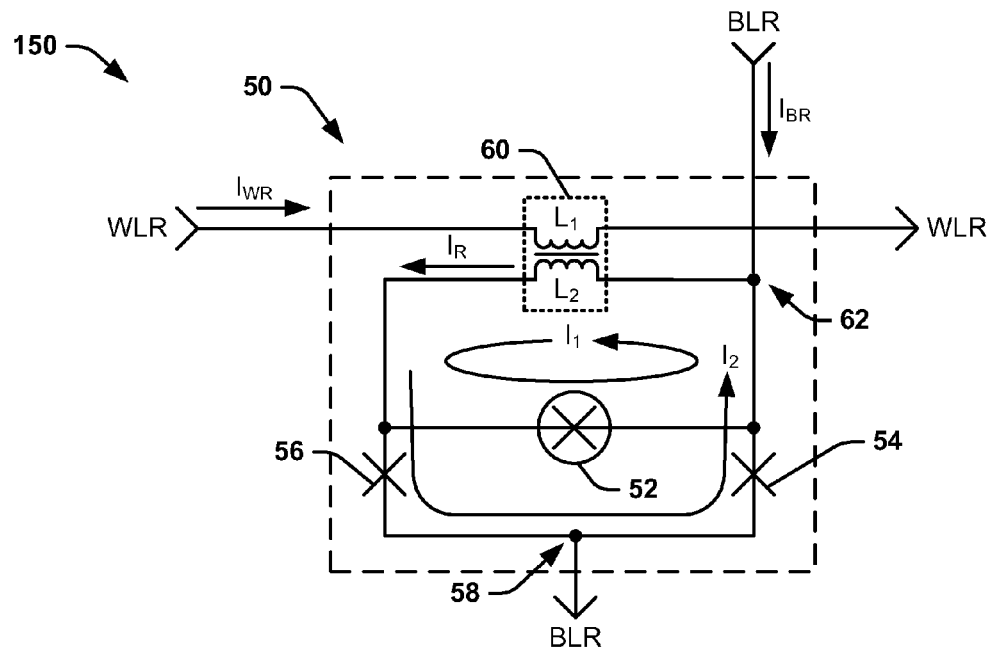
FIG. 4 illustrates an example of a diagram of readout of a JMRAM memory cell.

FIG. 4 illustrates an example of a diagram 150 of readout of the JMRAM memory cell circuit 50. The JMRAM memory cell circuit 50 is demonstrated in the example of FIG. 4 as excluding the bit-write line BLW and the word-write line WLW for simplicity. In the example of FIG. 4, the PHMJJ 52 is in a zero state, and thus stores the second binary state (e.g., logic-0). As a result, in the example of FIG. 4, the PHMJJ 52 provides a magnitude zero superconducting phase (i.e., no superconducting phase).

The word-read current $I_{WR}$ flows through the primary winding $L_1$ of the transformer 60 (e.g., as a current pulse), and is thus inductively provided to the PHMJJ 52 and the Josephson junctions 54 and 56 via a read current $I_R$ that is generated in the secondary winding $L_2$. Additionally, the bit-read current $I_{BR}$ is provided to the JMRAM memory cell circuit 50 at the node 62. Therefore, the read current $I_R$ induced by the word-read current $I_{WR}$ via the secondary winding $L_2$ is added to a portion of the bit-read current $I_{BR}$ based on the direction of current flow of the word-read current $I_{WR}$. In the example of FIG. 4, the induced word-read current $I_{WR}$ and the portion of the bit-read current $I_{BR}$ are combined to provide a first current loop $I_1$ that flows through the PHMJJ 52 and the secondary winding $L_2$ and a second current loop $I_2$ that flows through the Josephson junctions 54 and 56 and the secondary winding $L_2$. Because the PHMJJ 52 does not provide any superconducting phase, a portion of both the induced word-read current $I_{WR}$ and the bit-read current $I_{BR}$ flows through the PHMJJ 52 (i.e., the current loop $I_1$ in the example of FIG. 4). Therefore, this portion of both the induced word-read current $I_{WR}$ and the bit-read current $I_{BR}$ that flows through the PHMJJ 52 is diverted away from flowing through the Josephson junctions 54 and 56, leaving only the portion of the current loop $I_2$ as a sense current flowing through the Josephson junctions 54 and 56. The current loop $I_2$ can thus have a magnitude that is less than the critical current of the Josephson junctions 54 and 56, and is thus insufficient to trigger the Josephson junctions 54 and 56. Accordingly, a voltage that is measured on the bit-read line BLR maintains a substantially lesser magnitude (e.g., zero volts) to indicate the second binary state that is stored in the PHMJJ 52.

Figure 5:
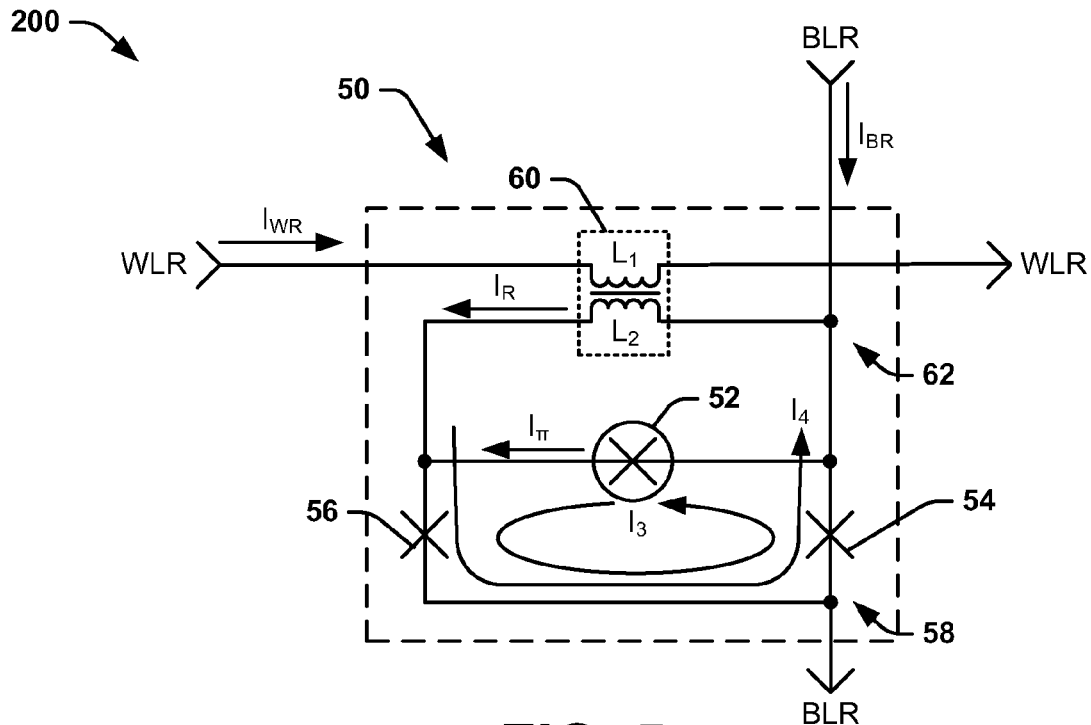
FIG. 5 illustrates another example of a diagram of readout of a JMRAM memory cell.

FIG. 5 illustrates another example of a diagram 200 of readout of the JMRAM memory cell circuit 50. Similar to as described previously in the example of FIG. 4, the JMRAM memory cell circuit 50 is demonstrated in the example of FIG. 5 as excluding the bit-write line BLW and the word-write line WLW for simplicity. In the example of FIG. 5, the PHMJJ 52 is in the positive π-state, and thus stores the first binary state (e.g., logic-1). As a result, in the example of FIG. 5, the PHMJJ 52 provides a superconducting phase that is demonstrated diagrammatically as a current $I_\pi$ provided in a predetermined direction based on application of the directional bias current $I_D$ during the data write operation.

Similar to as described previously, the read current $I_R$ is added to the portion of the bit-read current $I_{BR}$ based on the direction of current flow of the word-read current $I_{WR}$. However, because the PHMJJ 52 is in the positive π-state, and thus produces the superconducting phase demonstrated by the current $I_\pi$, the combined read current $I_R$ and bit-read current $I_{BR}$ are suppressed from flowing through the PHMJJ 52. Therefore, substantially all of the combined read current $I_R$ and portion of the bit-read current $I_{BR}$ flows through the Josephson junctions 54 and 56. In the example of FIG. 5, the read current $I_R$, the bit-read current $I_{BR}$, and the superconducting phase current $I_\pi$ are combined to provide a first current loop $I_3$ that flows through the PHMJJ 52 and the Josephson junctions 54 and 56 and a second current loop $I_4$ that flows through the Josephson junctions 54 and 56 and the secondary winding $L_2$. As an example, the first current loop $I_3$ can correspond to the current $I_\pi$ flowing as a supercurrent loop through the PHMJJ 52 and the Josephson junctions 54 and 56, and the second current loop $I_4$ can correspond to a sum of the read current $I_R$ and bit-read current $I_{BR}$. Because the first and second current loops $I_3$ and $I_4$ are combined to flow through the Josephson junctions 54 and 56, the combined first and second current loops $I_3$ and $I_4$ can have a magnitude that is greater than the critical current of the Josephson junction 56, and is thus sufficient to trigger the Josephson junction 56. In response, the Josephson junction 56 can trigger to generate a voltage pulse on the bit-read line BLR. The triggering of the Josephson junction 56 can thus cause the Josephson junction 54 to trigger, which can thus continue to provide sequential triggering between the Josephson junctions 54 and 56 in an oscillatory manner to substantially maintain the voltage pulses on the bit-read line BLR. Accordingly, the substantially increased voltage provided by the voltage pulses on the bit-read line BLR can indicate the first binary state that is stored in the PHMJJ 52.

It is to be understood that the JMRAM memory cell circuit 50 is not intended to be limited to the example of FIGS. 2 through 5. As an example, the JMRAM memory cell circuit 50 is demonstrated diagrammatically, such that the arrangement of the word-lines WLR and WLW and the bit-lines BLR and BLW with respect to each other and to the PHMJJ 52 can vary. For example, the configuration of the word-write line WLW and the bit-write line BLW can be such that the direction of current flow of the word-write current $I_{WW}$ and the bit-write current $I_{BW}$ can be opposite to store the digital state in the PHMJJ 52. In addition, the JMRAM memory cell circuit 50 is not limited to implementing a pair of Josephson junctions 54 and 56 in parallel with the PHMJJ 52, but could instead implement additional Josephson junctions or a single Josephson junction or could be configured as a variety of other arrangements. Accordingly, the JMRAM memory cell circuit 50 can be configured in a variety of ways.

Figure 6:
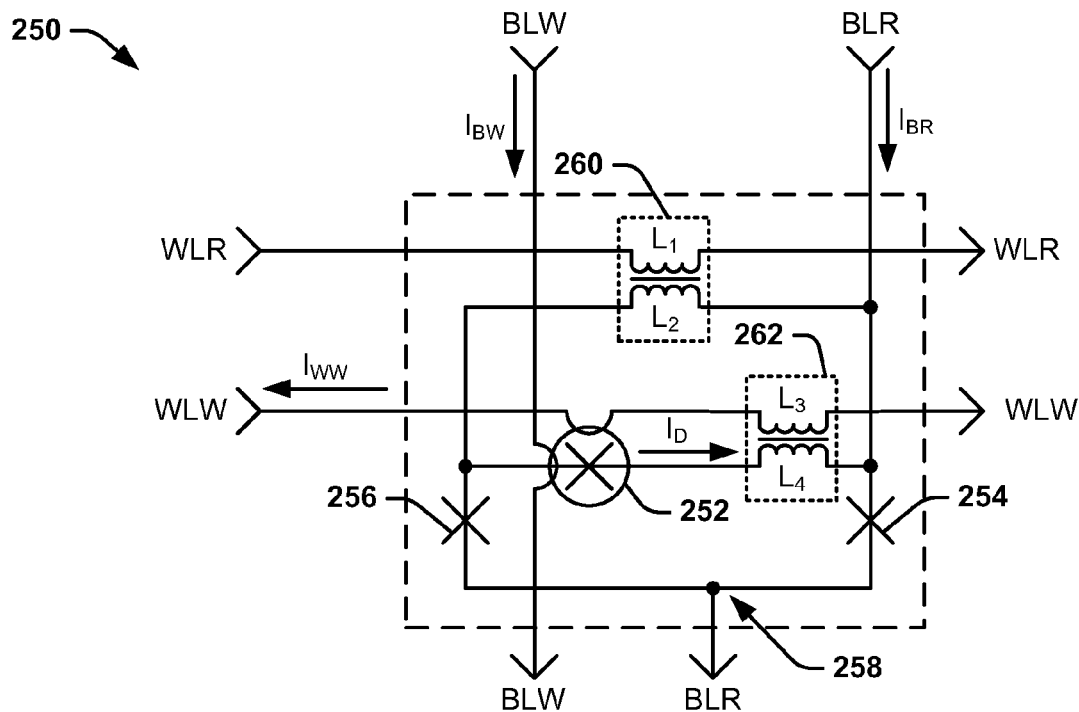
FIG. 6 illustrates another example of a JMRAM memory cell circuit.

FIG. 6 illustrates an example of a JMRAM memory cell circuit 250. As an example, the JMRAM memory cell circuit 250 can correspond to one of a plurality of JMRAM memory cells that are arranged in an array as rows and columns, as described in greater detail herein. The JMRAM memory cell circuit 250 can correspond to the JMRAM memory cell 10 in the example of FIG. 1.

The JMRAM memory cell circuit 250 can be configured substantially similar to the JMRAM memory cell circuit 50 in the example of FIG. 2. The JMRAM memory cell circuit 250 includes a word-write line WLW and a word-read line WLR that each pass through the JMRAM memory cell circuit 250. The word-write line WLW conducts a word-write current $I_{WW}$ during a data write operation and the word-read line WLR conducts a word-read current $I_{WR}$ during a data read operation. Similarly, the JMRAM memory cell circuit 250 includes a bit-write line BLW and a bit-read line BLR that each pass through the JMRAM memory cell circuit 250. The bit-write line BLW conducts a bit-write current $I_{BW}$ during the data write operation and the bit-read line BLR conducts a bit-read current $I_{BR}$ during the data read operation. The JMRAM memory cell circuit 250 also includes a PHMJJ 252 that is configured to store a digital state corresponding to one of the first binary state (e.g., logic-1) or the second binary state (e.g., logic-0). In the example of FIG. 6, the word-write line WLW and the bit-write line BLW are demonstrated as magnetically coupled to the PHMJJ 252, similar to as described previously. Therefore, based on the configuration of the PHMJJ 252, the word-write current $I_{WW}$ and the bit-write current $I_{BW}$ can generate the magnetic field to set the digital state of the PHMJJ 252 to the first binary state or the second binary state using magneto-current states of the PHMJJ 252, such as based on the respective directions of current flow during a data write operation.

In addition, the JMRAM memory cell circuit 250 includes a first Josephson junction 254 and a second Josephson junction 256. The Josephson junctions 254 and 256 are arranged in a loop with respect to the PHMJJ 252, and are coupled to the bit-read line BLR at a node 258. For example, the Josephson junctions 254 and 256 can be triggered during the data read operation in response to the respective word-read and bit-read currents $I_{WR}$ and $I_{BR}$, as well as a predetermined direction of the superconducting phase associated with the PHMJJ 252, to indicate that the PHMJJ 252 is in the first binary state, or not triggered to indicate that the PHMJJ 252 is in the second binary state, as described in greater detail herein.

In the example of FIG. 6, the JMRAM memory cell circuit 250 includes a first transformer 260 that includes a primary winding $L_1$ on the word-read line WLR through which the word-read current $I_{WR}$ flows. The first transformer 260 also includes a secondary winding $L_2$ that is inductively coupled to the primary winding $L_1$ and is arranged in parallel with the PHMJJ 252. The first transformer 260 can thus provide the read current $I_R$ during the data read operation, similar to as described previously in the examples of FIGS. 4 and 5. Additionally, the JMRAM memory cell circuit 250 includes a second transformer 262 that includes a primary winding $L_3$ on the word-write line WLW through which the word-write current $I_{WW}$ flows. The second transformer 262 also includes a secondary winding $L_4$ that is inductively coupled to the primary winding $L_3$ and is arranged in series with the PHMJJ 252. As an example, the second transformer 262 can correspond to the directional write element 16 in the example of FIG. 1. While the example of FIG. 6 demonstrates that the second transformer 262 is arranged such that the word-write current $I_{WW}$ flows through the primary winding $L_3$ on the word-write line WLW, it is to be understood that the secondary transformer 262 can be alternatively arranged. For example, the second transformer 262 can instead be arranged such that the bit-write current $I_{BW}$ flows through the primary winding $L_3$ on the bit-write line BLW.

For example, during a data write operation in which the first logic state (e.g., a logic-1) is to be written to the PHMJJ 252, the word-write current $I_{WW}$ can be provided on the word-write line WLW, and thus through the primary winding $L_3$, to induce a directional bias current $I_D$ that is provided via the secondary winding $L_4$. As another example, as described previously, the primary winding $L_3$ can instead be arranged on the bit-write line BLW, such that the bit-write current $I_{BW}$ can be provided through the primary winding $L_3$ to induce the directional bias current $I_D$ via the secondary winding $L_4$. The directional bias current $I_D$ can have a predetermined amplitude that is set to avoid triggering the Josephson junctions 254 and 256 during the data write operation described herein.

The directional bias current $I_D$ can thus flow through the PHMJJ 252 in a predetermined direction. As an example, the directional bias current $I_D$ can be provided through the PHMJJ 252 during substantially the entirety of the data write operation, and thus during the time that the PHMJJ 252 transitions to the π-state (e.g., as opposed to the example of FIG. 3). Therefore, the magnetic coupling of the word-write current $I_{WW}$ and the bit-write current $I_{BW}$ can set the magnetic state of the PHMJJ 252, while the directional bias current $I_D$ concurrently biases the PHMJJ 252 to force the directionality of the flux of the PHMJJ 252 in a predetermined direction. As a result, the PHMJJ 252 can be forced into being set in the positive π-state in response to the directional bias current $I_D$. Accordingly, the JMRAM memory cell circuit 250 can be read during the data read operation in a manner substantially similar to as described previously in the examples of FIGS. 4 and 5.

Figure 7:
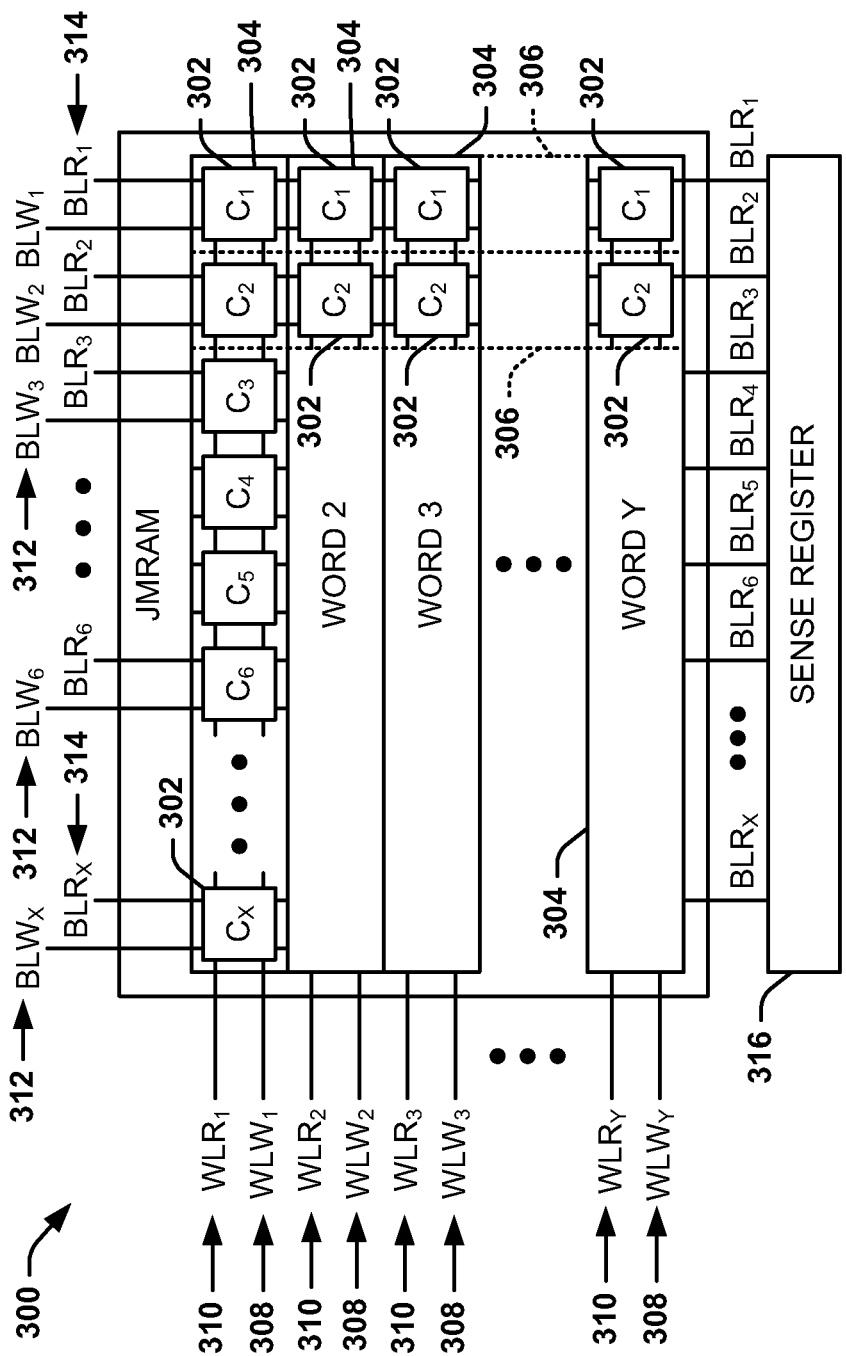
FIG. 7 illustrates an example of a Josephson magnetic random access memory (JMRAM) system.

FIG. 7 illustrates an example of a Josephson magnetic random access memory (JMRAM) system 300. The JMRAM system 300 can be implemented as a memory structure in a variety of computing applications.

The JMRAM system 300 is demonstrated in the example of FIG. 7 as being arranged as an array of JMRAM memory cells 302. Specifically, the JMRAM memory cells 302 are arranged in rows 304 that each correspond to a data word, demonstrated as WORD 1 through WORD Y, where Y is an integer greater than 1. Each of the rows 304 includes a set of JMRAM memory cells 302 that form X columns 306 across the rows 304, with the JMRAM memory cells 302 in WORD 1 being demonstrated in the example of FIG. 7 as $C_1$ to $C_X$, where X is an integer greater than 1. Therefore, each of the JMRAM memory cells 302 in the array of the JMRAM system 300 can be individually addressable by row 304 and column 306.

In the example of FIG. 7, each of the rows 304 is demonstrated as having an associated word-write line 308 and word-read line 310, demonstrated as $WLW_1$ and $WLR_1$ through $WLW_Y$ and $WLR_Y$, respectively. The word-write line 308 and word-read line 310 can be inductively and/or magnetically coupled to each of the JMRAM memory cells 302 in each of the rows 304 of the JMRAM system 300. In addition, each of the JMRAM memory cells 302 is demonstrated as having an associated bit-write line 312 and bit-read line 314, demonstrated as $BLW_1$ and $BLR_1$ through $BLW_X$ and $BLR_X$, respectively. The bit-write line 312 and bit-read line 314 can be coupled to each corresponding numbered JMRAM memory cell 302 in each of the rows 304 of the JMRAM system 300, such that the JMRAM memory cells 302 in each column 306 are arranged in series with respect to the bit-write line 312 and bit-read line 314. Although the example of FIG. 7 describes that the word-write lines 308 and word-read lines 310 and the bit-write lines 312 and bit-read lines 314 are arranged in series with other adjacent JMRAM memory cells in the respective row and column, the word-write lines 308 and word-read lines 310 and the bit-write lines 312 and bit-read lines 314 could instead be dedicated with respect to each JMRAM memory cell 302.

Each of the JMRAM memory cells 302 is configured to store a single bit of data. Specifically, each of the JMRAM memory cells 302 can include at least one PHMJJ that can be configured to store a digital state corresponding to a first binary state (e.g., logic-1) or a second binary state (e.g., logic-0). The digital state can be set in response to a word-write current that is provided on the respective word-write line 308 and a bit-write current that is provided on the respective bit-write line 312. Additionally, each of the JMRAM memory cells 302 can include a directional write element, such as a transformer, that can be configured to generate a directional bias current through the respective PHMJJ to force the PHMJJ to be set to the positive π-state in the first binary state. As an example, each of the JMRAM memory cells 302 can be configured substantially similar to the JMRAM memory cell circuit 50 in the example of FIG. 2 or the JMRAM memory cell circuit 250 in the example of FIG. 6.

Similarly, the respective digital state that is stored in each of the JMRAM memory cells 302 can be read from the JMRAM memory cells 302 based on a word-read current that is provided on the respective word-read line 310 to select a given one of the rows 304 and a bit-read current that is provided on the respective bit-read line 314. Specifically, the bit-read line 314 of each of the columns 306 is coupled to a sense register 316 that is configured to measure the respective bit-read line 314 to determine whether digital state of each of the JMRAM memory cells 302 of an associated row 304 correspond to the first binary state or the second binary state in response to the word-read current and the bit-read current during a data read operation. As an example, the sense register 316 can measure a voltage or a current associated with the bit-read line 314, as described in greater detail herein.

Figure 8:
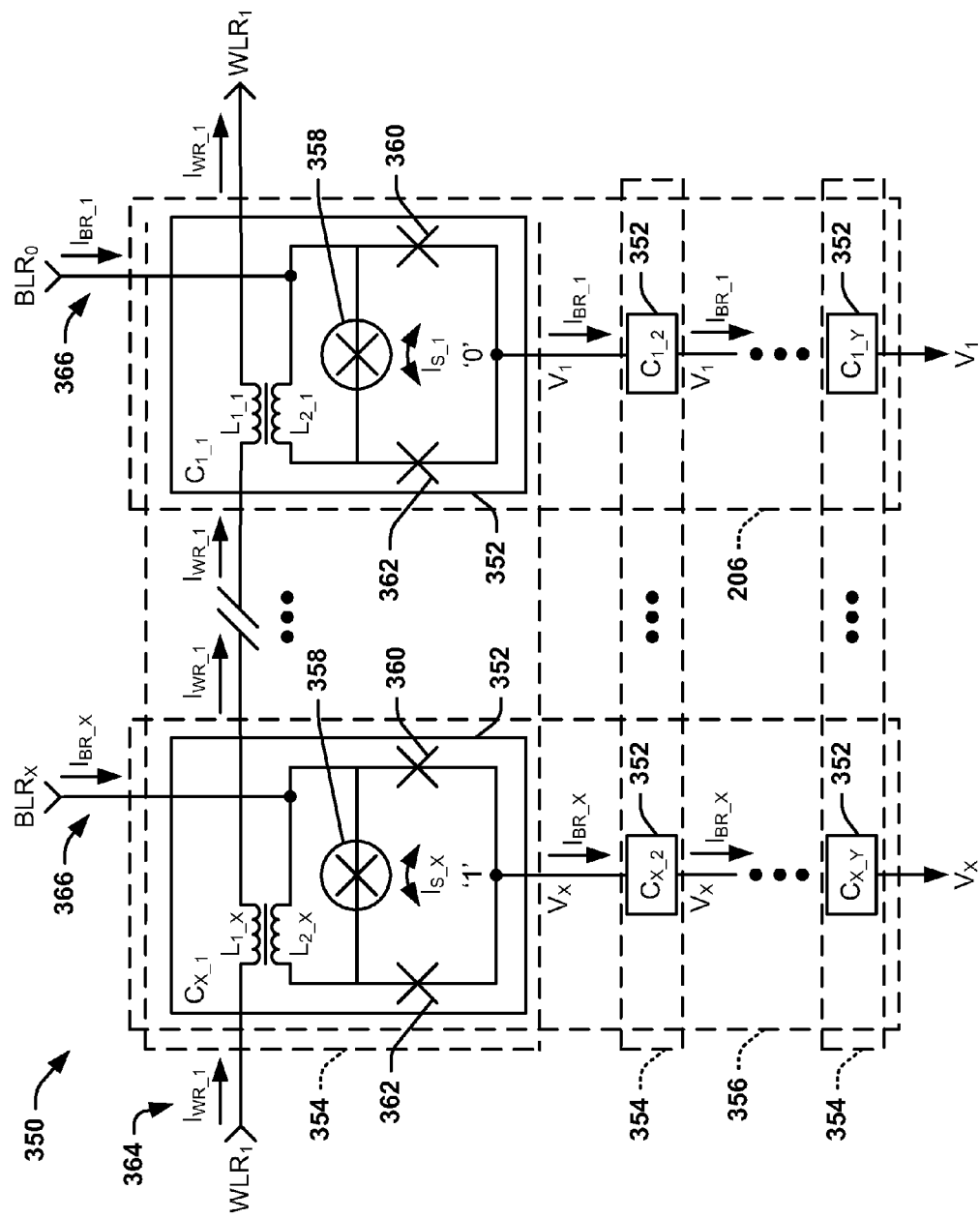
FIG. 8 illustrates another example of a JMRAM system.

FIG. 8 illustrates another example of a JMRAM system 350. The JMRAM system 350 can be configured similar to the JMRAM system 350 in the example of FIG. 7. Thus, reference is to be made to the example of FIG. 7 in the following description of the example of FIG. 8. Specifically, the example of FIG. 8 demonstrates a data read operation in which data is read from the JMRAM system 350.

The JMRAM system 350 is demonstrated in the example of FIG. 8 as being arranged as an array of JMRAM memory cells 352. Specifically, the JMRAM memory cells 352 are arranged in rows 354 that each correspond to a data WORD 1 through Y, where Y is an integer greater than 1. Each of the rows 354 includes a set of JMRAM memory cells 352 that form X columns 356 across the rows 354, where X is an integer greater than 1. In the example of FIG. 8, each of the demonstrated JMRAM memory cells 352 is designated by column and row, from $C_{1\_1}$ to $C_{X\_Y}$.

In the example of FIG. 8, the JMRAM memory cells 352 corresponding to JMRAM memory cells $C_{1\_1}$ and $C_{X\_1}$ are demonstrated in greater detail. Specifically, similar to the JMRAM memory cell circuit 50 in the example of FIG. 7, the JMRAM memory cells $C_{1\_1}$ and $C_{X\_1}$ include transformers that include primary windings $L_{1\_1}$ and $L_{1\_X}$, respectively, and secondary windings $L_{2\_1}$ and $L_{2\_X}$, respectively. The JMRAM memory cells $C_{1\_1}$ and $C_{X\_1}$ also each include a PHMJJ 358 in parallel with a pair of Josephson junctions 360 and 362. It is to be understood that the JMRAM memory cells $C_{1\_1}$ and $C_{X\_1}$ can also include word-write and bit-write lines, similar to as demonstrated in the example of FIG. 7, but have been omitted from the example of FIG. 8 for brevity. Additionally, the JMRAM memory cells $C_{1\_1}$ and $C_{X\_1}$ can also include directional write elements, which can be the demonstrated transformers or a separate transformer having a primary winding associated with the word-write line and a secondary winding that is arranged in series with the PHMJJ 358.

The JMRAM system 350 also includes a word-read line 364, demonstrated as $WLR_1$, thus corresponding to the 1$^{st}$ row 354, which passes through the primary windings $L_{1\_X}$ and $L_{1\_1}$ of the JMRAM memory cells $C_{X\_1}$ and $C_{1\_1}$, respectively. The JMRAM system 350 also includes bit-read lines 366, demonstrated as $BLR_X$ and $BLR_1$, thus corresponding to the X$^{th}$ and 1$^{st}$ columns 356, respectively. The bit-read lines 366 are demonstrated as coupled to the PHMJJs 358. It is to be understood that, while the example of FIG. 8 only demonstrates the word-read line $WLR_1$ and the bit-read lines $BLR_X$ and $BLR_1$, the JMRAM system 350 also includes additional word-read lines 364 for each of the rows 354 and additional bit-read lines 366 for each of the columns 356.

The word-read line $WLR_1$ conducts a word-read current pulse $I_{WR}$ that passes through the 1$^{st}$ row 354, including the JMRAM memory cells $C_{X\_1}$ and $C_{1\_1}$ which selects the 1$^{st}$ row 354 for reading. As a result, the word-read current $I_{WR}$ induces a current pulse from the primary windings $L_{1\_1}$ and $L_{1\_X}$, respectively, to the secondary windings $L_{2\_1}$ and $L_{2\_X}$, respectively. In addition, the bit-read lines $BLR_X$ and $BLR_1$ conduct bit-read currents $I_{BR\_X}$ and $I_{BR\_1}$, respectively, that pass through the X$^{th}$ and 1$^{st}$ columns 356, including the JMRAM memory cells $C_{X\_1}$ and $C_{1\_1}$. The collective current of the word-read current $I_{WR}$ and the bit-read currents $I_{BR\_X}$ and $I_{BR\_1}$ through the Josephson junctions 360 and 362 are demonstrated collectively in the JMRAM memory cells $C_{X\_1}$ and $C_{1\_1}$ as sense currents $I_{S\_X}$ and $I_{S\_1}$, respectively.

In the example of FIG. 8, the PHMJJ 358 that is associated with the JMRAM memory cell $C_{X\_1}$ is demonstrated as storing a binary logic-1 state ('1') and the PHMJJ 358 that is associated with the JMRAM memory cell $C_{1\_1}$ is demonstrated as storing a binary logic-0 state ('0'). The digital states of the JMRAM memory cells $C_{X\_1}$ and $C_{1\_1}$, as well as the remaining JMRAM memory cells 352 in the 1$^{st}$ row 354, could have been set in a previously performed data write operation. Similar to as described above in the example of FIG. 7, the PHMJJs 358 can provide a superconducting phase that affects the critical current of the Josephson junctions 360 and 362 depending on whether the PHMJJs 358 store a binary logic-1 state or a binary logic-0 state. Thus, by being set in the positive π-state, and thus by storing the binary logic-1 state, the PHMJJ 358 associated with the JMRAM memory cell $C_{X\_1}$ can provide a superconducting phase that generates a supercurrent that is added to the sense current $I_{S\_X}$ through the Josephson junctions 360 and 362, similar to as demonstrated in the example of FIG. 5. However, by storing the binary logic-0 state, the PHMJJ 358 associated with the JMRAM memory cell $C_{1\_1}$ can provide a zero superconducting phase, such that the sense current $I_{S\_1}$ through the Josephson junctions 360 and 362 is based on a portion of the added magnitudes of the word-read current $I_{WR}$ and the bit-read current $I_{BR\_1}$, similar to as demonstrated in the example of FIG. 4.

Based on the respective magnitudes of the sense currents $I_{S\_X}$ and $I_{S\_1}$ in response to the respective superconducting phases of the PHMJJs 358 relative to the critical currents of the Josephson junctions 360 and 362 of the JMRAM memory cells $C_{X\_1}$ and $C_{1\_1}$, the Josephson junctions 360 and 362 of the JMRAM memory cell $C_{X\_1}$ trigger and the Josephson junctions 360 and 362 of the JMRAM memory cell $C_{1\_1}$ do not trigger. During the data read operation, a sense register (not shown), such as the sense register 26 in the example of FIG. 7, can monitor a voltage $V_X$ associated with the bit-read line $BLR_X$ and a voltage $V_1$ associated with the bit-read line $BLR_1$. For example, the sense register can compare the voltages $V_X$ and $V_1$ with a threshold, such as to perform differential voltage sensing.

The Josephson junctions 360 and 362, upon triggering, can provide a voltage pulse, such that the voltage $V_X$ can have a magnitude that is greater than the voltage $V_1$. Accordingly, in the example of FIG. 8, the greater magnitude of the voltage $V_X$ and the lesser magnitude of the voltage $V_1$, such as relative to a threshold magnitude, can indicate that the JMRAM memory cell $C_{X\_1}$ stores a binary logic-1 state and the JMRAM memory cell $C_{1\_1}$ stores a binary logic-0 state. As another example, based on the superconductivity of the bit-read line BLR, the associated sense register can be configured to measure a magnitude of the bit-read currents $I_{BR\_X}$ and $I_{BR\_1}$ to determine the digital state of the respective JMRAM memory cells $C_{X\_1}$ and $C_{1\_1}$. It is to be understood that, while the example of FIG. 8 focuses on the $X^{th}$ and $1^{st}$ columns 356, bit-read currents can be provided for all of the columns 356 therebetween, such that associated voltages on the respective bit-read lines 366 can be monitored in a similar manner. Accordingly, the entire data word associated with the $1^{st}$ row 354 can be concurrently read during the data read operation. In this manner, the JMRAM memory cells 352 in any of the rows 354 can be read during the data read operation, as described in the example of FIG. 8.

Figure 9:
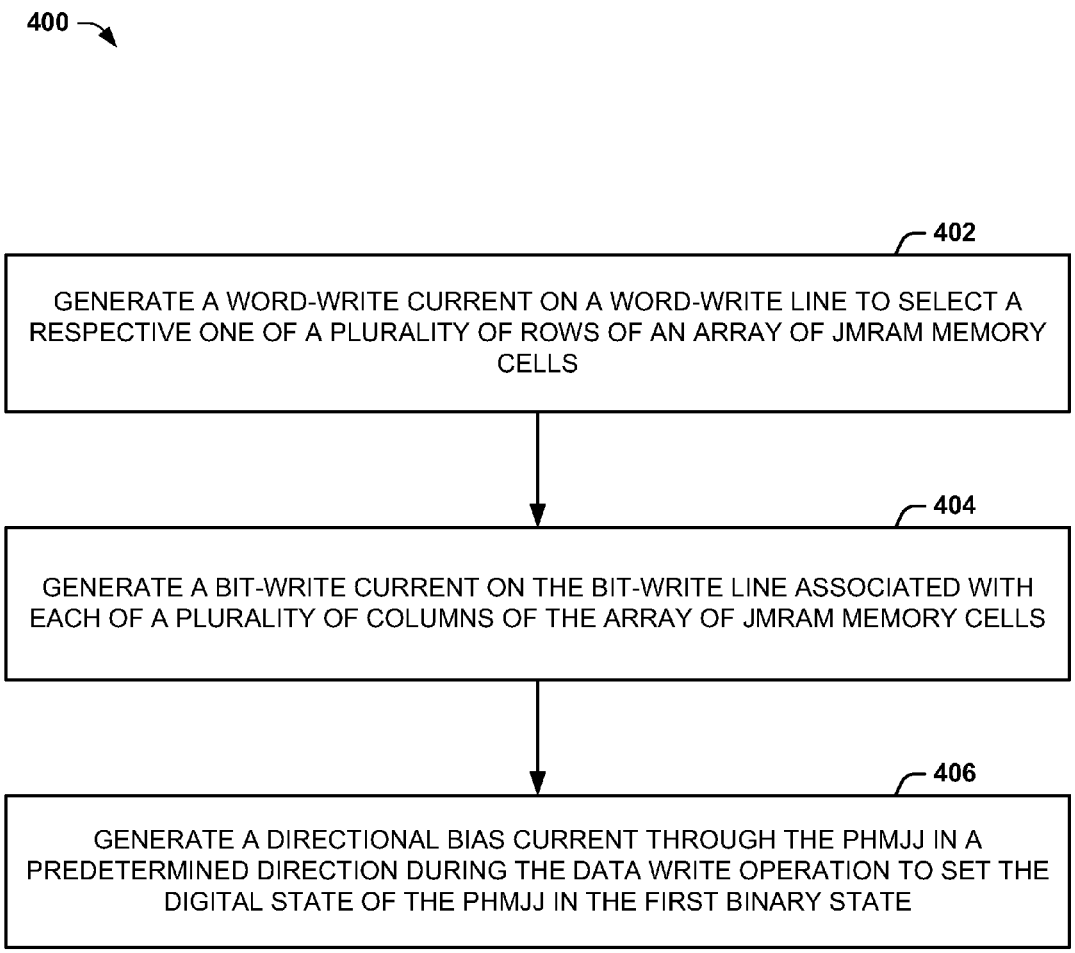
FIG. 9 illustrates an example of a method for writing a digital state to a JMRAM memory cell in a JMRAM system during a data write operation.

In view of the foregoing structural and functional features described above, a methodology in accordance with various aspects of the present invention will be better appreciated with reference to FIG. 9. While, for purposes of simplicity of explanation, the methodology of FIG. 9 is shown and described as executing serially, it is to be understood and appreciated that the present invention is not limited by the illustrated order, as some aspects could, in accordance with the present invention, occur in different orders and/or concurrently with other aspects from that shown and described herein. Moreover, not all illustrated features may be required to implement a methodology in accordance with an aspect of the present invention.

FIG. 9 illustrates an example of a method 400 for writing a digital state to a JMRAM memory cell (e.g., the JMRAM memory cell 10) in a JMRAM system (e.g., the JMRAM memory system 300) during a data write operation. At 402, a word-write current (e.g., the word-write current $I_{WW}$) is generated on a word-write line (e.g., the word-write line WLW) to select a respective one of a plurality of rows (e.g., the rows 304) of an array of JMRAM memory cells. Each of the JMRAM memory cells includes a PHMJJ (e.g., the PHMJJ 12) that is magnetically coupled to the word-write line and to a bit-write line (e.g., the bit-write line BLW) and that is configured to store the digital state corresponding to one of a first binary state (e.g., logic-1) and a second binary state (e.g., logic-0). At 404, a bit-write current (e.g., the bit-write current $I_{BW}$) is generated on the bit-write line associated with each of a plurality of columns (e.g., the columns 306) of the array of JMRAM memory cells. The digital state of the PHMJJ can be set in response to the word-write current and the bit-write current. At 406, a directional bias current (e.g., the directional bias current $I_D$) is generated through the PHMJJ in a predetermined direction during the data write operation to set the digital state of the PHMJJ in the first binary state. The directional bias current can provide a superconducting phase (e.g., the current $I_\pi$) of the PHMJJ corresponding to the first binary state.

What have been described above are examples of the invention. It is, of course, not possible to describe every conceivable combination of components or methodologies for purposes of describing the invention, but one of ordinary skill in the art will recognize that many further combinations and permutations of the invention are possible. Accordingly, the invention is intended to embrace all such alterations, modifications, and variations that fall within the scope of this application, including the appended claims.

What is claimed is:

1. A JMRAM memory cell comprising:
   a phase hysteretic magnetic Josephson junction (PHMJJ) that is configured to store one of a first binary state and a second binary state in response to a write current provided during a data write operation and to provide a superconducting phase based on the stored digital state;
   a directional write element configured to provide a directional bias current during the data write operation to provide the superconducting phase of the PHMJJ in a predetermined direction corresponding to the first binary state; and
   at least one Josephson junction having a critical current that is based on the superconducting phase of the PHMJJ and being configured to provide an output corresponding to the stored digital state in response to a read current that is provided during a read operation.

2. The JMRAM memory cell of claim 1, wherein the directional write element is configured as at least one transformer configured to inductively couple the read current from a primary winding to a secondary winding of the at least one transformer to provide the directional bias current through the PHMJJ in response to the read current during the data write operation.

3. The JMRAM memory cell of claim 1, wherein the directional write element is configured as at least one transformer comprising a primary winding that is coupled to one of a bit-write line and a word-write line on which the write current is provided and a secondary winding that is coupled in series with the PHMJJ, the at least one transformer being configured to inductively couple the write current through the PHMJJ to provide the directional bias current to the PHMJJ in response to the write current during the data write operation.

4. The JMRAM memory cell of claim 1, wherein the predetermined direction of the superconducting phase corresponds to a positive π-state of the PHMJJ with respect to the direction of the read current during the read operation.

5. The JMRAM memory cell of claim 1, wherein the PHMJJ is configured to generate the superconducting phase in response to storing the first binary state, wherein the read current combines with a supercurrent produced via the superconducting phase of the PHMJJ to trigger the at least one Josephson junction to provide a first magnitude of a voltage at an output of the JMRAM memory cell, the first magnitude of the voltage being indicative of the first binary state.

6. The JMRAM memory cell of claim 5, wherein the PHMJJ is configured to generate a zero superconducting phase in response to storing the other of the first and second binary states, wherein the combined read current and superconducting phase of the PHMJJ do not trigger the at least one Josephson junction, such that a second magnitude of the voltage is provided at the output, the second magnitude of the voltage being indicative of the other of the first and second binary states.

7. The JMRAM memory cell of claim 5, wherein the at least one Josephson junction is arranged as a pair of Josephson junctions, wherein in response to the PHMJJ storing the first binary state, the read current triggers the pair of Josephson junctions in an oscillatory manner to provide the first magnitude of the voltage at the output.

8. A Josephson magnetic random access memory (JMRAM) system comprising an array of JMRAM memory cells comprising the JMRAM memory cell of claim 1, the array of JMRAM memory cells being arranged in rows and columns, wherein the write current is a word-write current that is provided on a word-write line associated with a row of the array of JMRAM memory cells, wherein a second write current is provided on a bit-write line of the array of JMRAM memory cells as a bit-write current, wherein the read current is a word-read current that is provided on a word-read line associated with the row of the array of JMRAM memory cells, and wherein a second read current is provided on a bit-read line as a bit-read current.

9. The JMRAM of claim 8, wherein each of the word-write line and the bit-write line associated with a given JMRAM memory cell are magnetically coupled to the PHMJJ, wherein the word-write current is provided on the word-write line through each of the JMRAM memory cells in a given one of the rows during the data write operation, and wherein the bit-write line comprises a plurality of bit-write lines that are each associated with a respective one of the columns.

10. The JMRAM of claim 8, wherein the bit-read line comprises a plurality of bit-read lines that are each associated with a respective one of the columns, each of a respective plurality of bit-read currents being provided to the at least one Josephson junction associated with each of the respective JMRAM memory cells in a given one of the rows that is selected in response to the word-read current being provided during a data read operation to provide an indication of the stored digital state of each of the PHMJJs in the given one of the rows on the plurality of bit-read lines.

11. A method for writing a digital state to a JMRAM memory cell in a Josephson magnetic random access memory (JMRAM) system during a data write operation, the method comprising:
generating a word-write current on a word-write line to select a respective one of a plurality of rows of an array of JMRAM memory cells, each of the JMRAM memory cells comprising a phase hysteretic magnetic Josephson junction (PHMJJ) that is magnetically coupled to the word-write line and to a bit-write line and that is configured to store the digital state corresponding to one of a first binary state and a second binary state;
generating a bit-write current on the bit-write line associated with each of a plurality of columns of the array of JMRAM memory cells, the digital state of the PHMJJ being set in response to the word-write current and the bit-write current; and
generating a directional bias current through the PHMJJ in a predetermined direction during the data write operation to set the digital state of the PHMJJ in the first binary state, the directional bias current providing a superconducting phase of the PHMJJ corresponding to the first binary state.

12. The method of claim 11, wherein generating the directional bias current comprises generating the directional bias current via at least one transformer.

13. The method of claim 12, wherein generating the directional bias current via the at least one transformer comprises providing a read current through a primary winding of the at least one transformer, the primary winding being inductively coupled to a secondary winding of the at least one transformer, the secondary winding being coupled to PHMJJ, such that the at least one transformer induces the directional bias current through the PHMJJ in response to the read current during the data write operation.

14. The method of claim 12, wherein generating the directional bias current via the at least one transformer comprises providing one of the word-write current and the bit-write current through a primary winding of the at least one transformer, the primary winding being inductively coupled to a secondary winding of the at least one transformer, the secondary winding being arranged in series with the PHMJJ, such that the at least one transformer induces the directional bias current through the PHMJJ in response to the respective one of the word-write current and the bit-write current during the data write operation.

15. The method of claim 11, wherein generating the directional bias current comprises generating the directional bias current to set the PHMJJ in a positive $\pi$-state, such that a supercurrent produced via the superconducting phase is substantially additive with at least one of a word-read current associated with the plurality of rows of the array of JMRAM memory cells and a bit-read current associated with the plurality of columns of the array of JMRAM memory cells to trigger at least one Josephson junction associated with the JMRAM memory cell to indicate the first binary state of the PHMJJ during a data read operation.

16. A Josephson magnetic random access memory (JMRAM) array system comprising:
a plurality of JMRAM memory cells, each of the plurality of JMRAM memory cells comprising:
a phase hysteretic magnetic Josephson junction (PHMJJ);
a directional write element configured to provide a directional bias current during a data write operation to set the PHMJJ in a positive $\pi$-state corresponding to a first binary state; and
at least one Josephson junction;
a plurality of word-write lines each configured to conduct a respective word-write current that selects a given row of the plurality of JMRAM memory cells during the data write operation;
a plurality of bit-write lines each configured to conduct a respective bit-write current to write a digital state corresponding to one of the first binary state and a second binary state into the PHMJJ associated with each JMRAM memory cell of the given row of plurality of JMRAM memory cells, the PHMJJ being magnetically coupled to a respective one of the plurality of word-write lines and a respective one of the plurality of bit-write lines;

a plurality of word-read lines each configured to conduct a respective word-read current that selects a given row of plurality of JMRAM memory cells during a data read operation; and a plurality of bit-read lines each configured to conduct a respective bit-read current through each of the plurality of JMRAM memory cells in a given column, the at least one Josephson junction providing an indication of the stored digital state during the data read operation in response to the word-read current, the bit-read current, and a superconducting phase provided by the PHMJJ.

17. The system of claim 16, wherein the directional write element in each of the plurality of JMRAM memory cells is configured as at least one transformer configured to inductively couple the read current from a primary winding to a secondary winding of the at least one transformer to provide the directional bias current through the PHMJJ in response to the read current during the data write operation.

18. The system of claim 16, wherein the directional write element in each of the plurality of JMRAM memory cells is configured as at least one transformer comprising a primary winding that is coupled to a respective one of the plurality of word-write lines and a secondary winding that is coupled in series with the PHMJJ, the at least one transformer being configured to inductively couple the respective word-write current to the PHMJJ to provide the directional bias current through the PHMJJ in response to the word-write current during the data write operation.

19. The system of claim 16, wherein a supercurrent produced via the superconducting phase associated with a respective one of the plurality of JMRAM memory cells is substantially additive with a respective one of the plurality of word-read currents and a respective one of the plurality of bit-read currents to trigger the at least one Josephson junction associated with the respective one of the plurality of JMRAM memory cells to indicate the first binary state of the PHMJJ during the data read operation.

20. The system of claim 19, further comprising a sense register configured to monitor a voltage associated with each of the plurality of JMRAM memory cells of the given row during the data read operation, the sense register being configured to detect the triggering of the at least one Josephson junction of the respective one of the plurality of JMRAM memory cells to provide the voltage having a first magnitude on an associated bit-read line on which the bit-read current is provided, the first magnitude of the voltage being indicative of the first binary state.

* * * * *